(12) United States Patent
Tu

(10) Patent No.: US 11,342,383 B2
(45) Date of Patent: May 24, 2022

(54) DISPLAY PANEL AND DISPLAY TERMINAL

(71) Applicant: Shenzhen China Star Optoelectronics Semiconductor Display Technology Co., Ltd., Shenzhen (CN)

(72) Inventor: Aiguo Tu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 306 days.

(21) Appl. No.: 16/626,375

(22) PCT Filed: Nov. 21, 2019

(86) PCT No.: PCT/CN2019/119847
§ 371 (c)(1),
(2) Date: Dec. 24, 2019

(87) PCT Pub. No.: WO2021/092988
PCT Pub. Date: May 20, 2021

(65) Prior Publication Data
US 2021/0359027 A1 Nov. 18, 2021

(30) Foreign Application Priority Data
Nov. 11, 2019 (CN) .......................... 201911093864.1

(51) Int. Cl.
*H01L 27/32* (2006.01)

(52) U.S. Cl.
CPC ........ *H01L 27/3211* (2013.01); *H01L 27/322* (2013.01); *H01L 27/3244* (2013.01)

(58) Field of Classification Search
CPC ............... H01L 27/3211; H01L 27/322; H01L 27/3244; H01L 27/3232
See application file for complete search history.

(56) References Cited

U.S. PATENT DOCUMENTS

| | | | | |
|---|---|---|---|---|
| 2018/0181239 A1* | 6/2018 | Hao | ..................... | G06F 3/0412 |
| 2018/0314371 A1* | 11/2018 | Jin | ......................... | G06F 3/047 |
| 2019/0155436 A1* | 5/2019 | Jin | ..................... | G02F 1/134309 |
| 2020/0073168 A1* | 3/2020 | Zhao | ................... | G02F 1/13306 |
| 2020/0201109 A1* | 6/2020 | Zhao | ................... | G02F 1/13452 |
| 2021/0208452 A1* | 7/2021 | Hu | ................... | G02F 1/133516 |
| 2021/0359006 A1* | 11/2021 | Sun | ...................... | H01L 27/323 |

\* cited by examiner

*Primary Examiner* — Karen Kusumakar
*Assistant Examiner* — Adam S Bowen

(57) ABSTRACT

The present disclosure provides a display panel and a display terminal, the display panel including an array substrate, a display device layer, and a color filter layer, wherein the display device layer includes a plurality of sub-pixel cycle units continuously arranged, and the sub-pixel cycle unit includes a plurality of sub-pixels. A part of sub-pixels is covered with the color resistors having colors corresponding to that of the sub-pixels to increase the color gamut of the sub-pixels, and meanwhile, sub-pixels not covered by the color resistors are used to increase brightness of the sub-pixels, thereby reducing the power consumption of the display panel, and improving a service life of the display panel, while improving a color gamut of the display panel.

15 Claims, 1 Drawing Sheet

DISPLAY PANEL AND DISPLAY TERMINAL

RELATED APPLICATIONS

This application is a National Phase of PCT Patent Application No. PCT/CN2019/119847 having International filing date of Nov. 21, 2019, which claims the benefit of priority of Chinese Patent Application No. 201911093864.1 filed on Nov. 11, 2019. The contents of the above applications are all incorporated by reference as if fully set forth herein in their entirety.

FIELD AND BACKGROUND OF THE INVENTION

The present invention relates to a field of display technologies, and in particular, to a display panel and a display terminal.

In a large-sized organic light-emitting diode (OLED) display panel, in order to achieve higher resolution, it is necessary to increase a number of thin film transistors (TFTs) in a pixel circuit of the OLED display panel, so that an aperture ratio of pixels is decreased. Meanwhile, in order to achieve a higher color gamut, a color filter needs to be added above the light-emitting diode. However, the color filter filters part of the light emitted by the OLED, eventually resulting in a decrease in the brightness of a display terminal.

In order to increase brightness of the OLED display panel, it is necessary to increase current of the organic light emitting diode, thereby causing a great decrease in efficiency of the organic light emitting diode, and a great increase in power consumption of the OLED display panel, thereby reducing a service life of the OLED display panel.

In summary, the existing display panel has a problem of lowering the efficiency of the organic light emitting diode and increasing the power consumption of the display panel while achieving higher resolution. Therefore, it is necessary to provide a display panel and a display terminal to improve this defect.

SUMMARY OF THE INVENTION

Embodiments of the present disclosure provide a display panel and a display terminal for solving the problem of lowering the efficiency of the organic light emitting diode and increasing the power consumption of the existing display panel while achieving higher resolution.

An embodiment of the present disclosure provides a display panel, including:
    an array substrate;
    a display device layer disposed on the array substrate, including a plurality of sub-pixel cycle units continuously arranged, each of the sub-pixel cycle units including a plurality of sub-pixels of different colors and sequentially arranged; and
    a color filter layer disposed on a side of the display device layer away from the array substrate, and including color resistor cycle units in a one-to-one correspondence to the sub-pixel cycle units, wherein the color resistor cycle units include a plurality of color resistors corresponding to a portion of sub-pixels.

In accordance with an embodiment of the present disclosure, in the sub-pixel cyclic units, adjacent ones of the sub-pixels of a same color are spaced apart from each other by two adjacent sub-pixels of different colors.

In accordance with an embodiment of the present disclosure, in the sub-pixel cyclic units, each of the adjacent ones of the sub-pixels of the same color constitutes a pixel unit with a sub-pixel at its one side and a sub-pixel at its another side, and adjacent ones of the pixel unit share two of the sub-pixels at an overlap between the adjacent ones of the pixel units.

In accordance with an embodiment of the present disclosure, in the sub-pixel cycle units, at least one of the sub-pixels of the same color has a corresponding color resistor in the color resistor cycle unit In accordance with an embodiment of the present disclosure, in the sub-pixel cyclic units, an area of an opening of each of the sub-pixels of the same color with a corresponding color resistor is smaller than an area of an opening of each of the sub-pixels of the same color without a corresponding color resistor.

In accordance with an embodiment of the present disclosure, each of the sub-pixel cycle units includes a red sub-pixel, a green sub-pixel, and a blue sub-pixel, and the red sub-pixel is disposed between the blue sub-pixel and the green sub-pixel.

In accordance with an embodiment of the present disclosure, each of the sub-pixel cycle units includes two red sub-pixels, and the color resistor cycle units includes red color resistors in a one-to-one correspondence to the red sub-pixels.

In accordance with an embodiment of the present disclosure, each of the color resistor cycle units further includes a green color resistor and a blue color resistor, and the green color resistor is separated from the blue color resistor by one of the red color resistors.

In accordance with an embodiment of the present disclosure, each of the sub-pixel cycle units includes six of the sub-pixels.

An embodiment of the present disclosure provides a display terminal, including a display panel, where the display panel includes:
    an array substrate;
    a display device layer disposed on the array substrate, including a plurality of sub-pixel cycle units continuously arranged, each of the sub-pixel cycle units including a plurality of sub-pixels of different colors and sequentially arranged; and
    a color filter layer disposed on a side of the display device layer away from the array substrate, and including color resistor cycle units in a one-to-one correspondence to the sub-pixel cycle units, wherein the color resistor cycle units include a plurality of color resistors corresponding to a portion of sub-pixels.

In accordance with an embodiment of the present disclosure, in the sub-pixel cyclic units, adjacent ones of the sub-pixels of a same color are spaced apart from each other by two adjacent sub-pixels of different colors.

In accordance with an embodiment of the present disclosure, in the sub-pixel cyclic units, each of the adjacent ones of the sub-pixels of the same color constitutes a pixel unit with a sub-pixel at its one side and a sub-pixel at its another side, and adjacent ones of the pixel unit share two of the sub-pixels at an overlap between the adjacent ones of the pixel units.

In accordance with an embodiment of the present disclosure, in the sub-pixel cycle units, at least one of the sub-pixels of the same color has a corresponding color resistor in the color resistor cycle units.

In accordance with an embodiment of the present disclosure, in the sub-pixel cyclic units, an area of an opening of each of the sub-pixels of the same color with a corresponding color resistor is smaller than an area of an opening of each of the sub-pixels of the same color without a corresponding color resistor.

In accordance with an embodiment of the present disclosure, each of the sub-pixel cycle units includes a red sub-pixel, a green sub-pixel, and a blue sub-pixel, and the red sub-pixel is disposed between the blue sub-pixel and the green sub-pixel.

In accordance with an embodiment of the present disclosure, each of the sub-pixel cycle units includes two red sub-pixels, and the color resistor cycle units includes red color resistors in a one-to-one correspondence to the red sub-pixels.

In accordance with an embodiment of the present disclosure, each of the color resistive cycle units further includes a green color resistor and a blue color resistor, and the green color resistor is separated from the blue color resistor by one of the red color resistors In accordance with an embodiment of the present disclosure, each of the sub-pixel cycle units includes six of the sub-pixels.

An embodiment of the present disclosure further provides a display terminal, including a display panel, where the display panel includes:

an array substrate;

a display device layer disposed on the array substrate, including a plurality of sub-pixel cycle units continuously arranged, each of the sub-pixel cycle units including a plurality of sub-pixels of different colors and sequentially arranged; and a color filter layer disposed on a side of the display device layer away from the array substrate, and including color resistor cycle units in a one-to-one correspondence to the sub-pixel cycle units, wherein the color resistor cycle units include a plurality of color resistors corresponding to a portion of sub-pixels;

wherein, in the sub-pixel cycle units, at least one of the sub-pixels of a same color has a corresponding color resistor in the color resistor cycle units.

In accordance with an embodiment of the present disclosure, in the sub-pixel cyclic units, each of the adjacent ones of the sub-pixels of the same color constitutes a pixel unit with a sub-pixel at its one side and a sub-pixel at its another side, and adjacent ones of the pixel unit share two of the sub-pixels at an overlap between the adjacent ones of the pixel units.

Advantageous effects of the present invention: embodiments of the present disclosure provide a plurality of sub-pixel cycle units arranged in an array in a display device layer, and color resistor cycle units disposed in a one-to-one correspondence to the sub-pixel cycle units in a color filter layer, wherein the color resistor cycle units include a plurality of color resistors corresponding to a portion of sub-pixels. A part of sub-pixels is covered with the color resistors having colors corresponding to that of the sub-pixels to increase the color gamut of the sub-pixels, and meanwhile, sub-pixels not covered by the color resistors are used to increase brightness of the sub-pixels, thereby reducing the power consumption of the display panel, and improving a service life of the display panel, while improving a color gamut of the display panel.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

The following description of the various embodiments is provided to illustrate the specific embodiments of the present invention. The spatially relative directional terms mentioned in the present invention, such as "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

The present disclosure will be further described below in conjunction with the accompanying drawings and specific embodiments:

An embodiment of the present disclosure provides a display panel, which will be described in detail below with reference to FIGS. 1 and 2.

Figure 1:
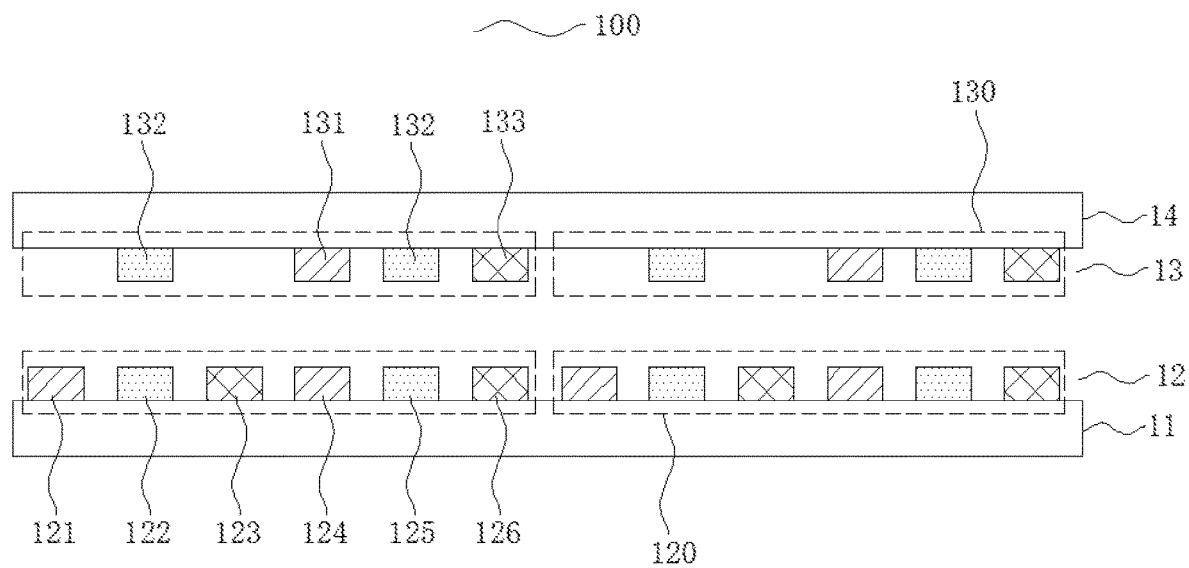
FIG. 1 is a schematic diagram of a cross-sectional structure of a display panel according to an embodiment of the present disclosure.

As shown in FIG. 1, FIG. 1 is a schematic diagram of a cross-sectional structure of a display panel according to an embodiment of the present disclosure. The display panel 100 includes an array substrate 11, a display device layer 12, a color filter layer 13, and a package cover plate 14.

The array substrate 11 includes a base substrate and a thin film transistor layer (not shown) disposed on the base substrate. The thin film transistor layer includes a plurality of thin film transistors for forming a sub-pixel driving circuit of the display panel 100. The specific structures of the array substrate 11 and the sub-pixel driving circuit are the same as that of the array substrate in the prior art, and details are not described herein for brevity.

The display device layer 12 is disposed on the array substrate 11 and includes a plurality of sub-pixel cycle units 120 continuously arranged, and each of the sub-pixel cycle units 120 including a plurality of sub-pixels of different colors and sequentially arranged. The sub-pixels include an organic light-emitting diode constituted by a pixel-definition layer, an anode layer, a light-emitting layer, and a cathode layer (not shown) which are stacked, and the sub-pixels further includes an opening, through which light emitted by the sub-pixels passes in the light-emitting layer. The specific structure of the sub-pixel is the same as that in the prior art, and details are not described herein for brevity.

Figure 2:
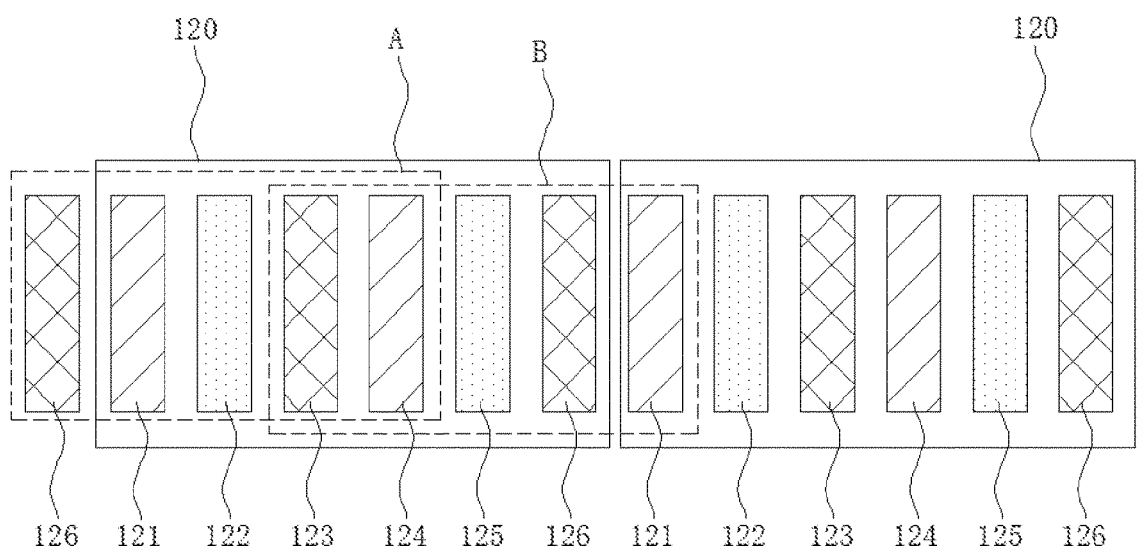
FIG. 2 is a schematic diagram of a planar structure of a display panel according to an embodiment of the present disclosure.

As shown in FIG. 2, FIG. 2 is a schematic diagram of a planar structure of a display panel 100 according to an embodiment of the present disclosure. The sub-pixel cycle units include six sub-pixels, which are a first sub-pixel 121, a second sub-pixel 122, a third sub-pixel 123, a fourth sub-pixel 124, a fifth sub-pixel 125, and a sixth sub-pixel 126 sequentially arranged. The first sub-pixel 121 and the fourth sub-pixel 124 have a same color, the second sub-pixel 122 and the fifth sub-pixel 125 have a same color, and the third sub-pixel 123 and the sixth sub-pixel 126 have a same color, the adjacent first sub-pixel 121 and fourth sub-pixel 124 of a same color are spaced apart from each other by the second sub-pixel 122 and the third sub-pixel 123 of different colors, which are also different from the colors of the first sub-pixel 121 and the fourth sub-pixel 124, and the other adjacent ones of the sub-pixels of a same color are spaced apart from each other similarly by two adjacent sub-pixels of different colors.

In this embodiment, in the same sub-pixel cycle units 120, each of the adjacent ones of the sub-pixels of the same color constitutes a pixel unit with a sub-pixel at its one side and a sub-pixel at its another side, and adjacent ones of the pixel units share two of the sub-pixels at an overlap between the adjacent ones of the pixel units.

As shown in FIG. 2, the second sub-pixel 122 in the sub-pixel cycle units 120, the first sub-pixel 121 located at a left side of the second sub-pixel 122, the sixth sub-pixel 126 in a sub-pixel cycle unit 120 of a previous-level, and the third sub-pixel 123 and the fourth sub-pixel 124 located at a right side of the second sub-pixel 122, together constitute a pixel unit A. The fifth sub-pixel 125, the third sub-pixel 123 at a left side of the fifth sub-pixel 125, the fourth sub-pixel 124, the sixth sub-pixel 126 located at a right side of the fifth sub-pixel 125, and the first sub-pixel 121 of in the sub-pixel cyclic unit 120 of a next-level, together constitute a pixel unit B. The pixel unit A and the pixel unit B share the third sub-pixel 123 and the fourth pixel 124 at an overlap between the adjacent two pixel units.

Of course, in some other embodiments, the same technical effect can also be achieved by constituting the pixel unit by the first sub-pixel 121 and the fourth pixel 124 or constituting the pixel unit by the third sub-pixel 123 and the fourth sub-pixel 124, and the invention is not particularly limited.

In this embodiment, the color filter layer 13 is disposed on a side of the display device layer 12 away from the array substrate 11. The color filter layer 13 includes a plurality of color resistor cycle units 130 in a one-to-one correspondence to the sub-pixel cycle units, wherein the color resistor cycle units 130 include a plurality of color resistors corresponding to a portion of sub-pixels in the sub-pixel cycle units 120, that is, some of the sub-pixels in the sub-pixel cycle units 120 is not corresponded by the color resistors.

In this embodiment, the first sub-pixel 121 and the fourth sub-pixel 124 are blue sub-pixels, the second sub-pixel 122 and the fifth sub-pixel 125 are red sub-pixels, the third sub-pixel 123 and the sixth sub-pixel 126 are green sub-pixels, and the second sub-pixel 122 is disposed between the first sub-pixel 121 and the third sub-pixel 123.

Specifically, as shown in FIG. 1, the fourth sub-pixel 124 has a corresponding blue color resistor 131 in the color resistor cycle units 130, the sixth sub-pixel 126 has a corresponding green color resistor 132 in the color resistor cycle units 130, each of the second sub-pixels 122 and the fifth sub-pixels 125 has a corresponding red color resistor 133 in the color resistor cycle units 130, and the blue color resistor 131 and the green color resistor 133 are spaced apart from each other by a red color resistor 132 disposed therebetween.

Each of the fourth sub-pixel 124 and the sixth sub-pixel 126 has a color resistor corresponding to the color thereof, and is mainly configured to adjust the colors of the sub-pixels in the display panel 100, while the first sub-pixel 121 and the third sub-pixel 123 that are not corresponded by the color resistors are primarily configured to emit light of a corresponding color and provide sufficient brightness.

Due to the characteristics of an organic material of the light-emitting layer in the red sub-pixel, the light-emitting efficiency and the service life of the red sub-pixel light-emitting layer are higher than that of the green sub-pixel and the blue sub-pixel, and it does not impact the overall life of the display panel 100 with the color resistors disposed on an opposite side of the red sub-pixel and an increase in a current applied to the red sub-pixel. Therefore, the second sub-pixel 122 and the fifth sub-pixel 125 both have corresponding red color resistors so as to increase the display color gamut of the display panel 100 while providing sufficient display brightness. In addition, the sub-pixel unit A, the sub-pixel unit B, or another sub-pixel unit formed includes only one red sub-pixel, and its object is to prevent the sub-pixels of other colors from decreasing in light-emitting efficiency, and the color of the red sub-pixels is more prominent when the color changes, causing an overall color tone of the display panel 100 to turn red or warm, thereby ensuring the normal display effect of the display panel 100.

Further, in order to prevent an existence of a photoresist from reducing the light-emitting efficiency of the sub-pixels, an area of an opening of the fourth sub-pixel 124 is smaller than an area of an opening of the first sub-pixel 121, and an area of an opening of the sixth sub-pixel 126 is smaller than an area of an opening of the third sub-pixel 123, such that the light-emitting brightness of the sub-pixels of each color in the pixel unit 120 is elevated, eliminating an need to increase a current applied to the light-emitting diodes in the sub-pixels, reducing power consumption of the display panel 100, thereby improving a service life of the display panel 100.

Of course, in some other embodiments, the first sub-pixel 121 and the third sub-pixel 123 in the color resistor cycle units 130 may also be corresponded by the color resistors of colors corresponding thereto. In such a case, the area of the opening of the first sub-pixel 121 should be smaller than the area of the opening of the fourth sub-pixel 124, and the area of the opening of the third sub-pixel 123 should be smaller than the area of the opening of the sixth sub-pixel 126, which can achieve the same technical effects as those of the above embodiments, and details are not repeated herein for brevity.

Advantageous effects of the present invention: embodiments of the present disclosure provide a plurality of sub-pixel cycle units arranged in an array in a display device layer, and color resistor cycle units disposed in a one-to-one correspondence to the sub-pixel cycle units in a color filter layer, wherein the color resistor cycle units include a plurality of color resistors corresponding to a portion of sub-pixels. A part of sub-pixels is covered with the color resistors having colors corresponding to that of the sub-pixels to increase the color gamut of the sub-pixels, and meanwhile, sub-pixels not covered by the color resistors are used to increase brightness of the sub-pixels, thereby reducing the power consumption of the display panel, and improving a service life of the display panel, while improving a color gamut of the display panel.

An embodiment of the present disclosure further provides a display terminal, which includes the display panel provided in the above embodiments, which can achieve the same technical effects as the display panel provided in the foregoing embodiments, and details are not repeated herein for brevity. The display terminal may be a wearable device, such as a smart bracelet, a smart watch, a VR device, or the like, or may be a foldable and rollable organic light emitting diode display device or a display device such as an electronic book, an electronic newspaper, a mobile phone, a television, a computer, etc.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising:
   an array substrate;
   a display device layer disposed on the array substrate, comprising a plurality of sub-pixel cycle units continuously arranged, each of the sub-pixel cycle units comprising a plurality of sub-pixels of different colors and sequentially arranged; and
   a color filter layer disposed on a side of the display device layer away from the array substrate, and comprising color resistor cycle units in a one-to-one correspondence to the sub-pixel cycle units, wherein the color resistor cycle units comprise a plurality of color resistors corresponding to a portion of sub-pixels, and some of the sub-pixels in the sub-pixel cycle units are not covered by the color resistors.

2. The display panel according to claim 1, wherein in the sub-pixel cyclic units, adjacent ones of the sub-pixels of a same color are spaced apart from each other by two adjacent sub-pixels of different colors.

3. The display panel according to claim 2, wherein in the sub-pixel cyclic units, each of the adjacent ones of the sub-pixels of the same color constitutes a pixel unit with a sub-pixel at its one side and a sub-pixel at its another side, and adjacent ones of the pixel units share two of the sub-pixels at an overlap between the adjacent ones of the pixel units.

4. The display panel according to claim 3, wherein in the sub-pixel cycle units, at least one of the sub-pixels of the same color has a corresponding color resistor in the color-resistor cycle units.

5. The display panel according to claim 4, wherein in the sub-pixel cyclic units, an area of an opening of each of the sub-pixels of the same color with a corresponding color resistor is smaller than an area of an opening of each of the sub-pixels of the same color without a corresponding color resistor.

6. The display panel according to claim 5, wherein each of the sub-pixel cycle units comprises a red sub-pixel, a green sub-pixel, and a blue sub-pixel, and the red sub-pixel is disposed between the blue sub-pixel and the green sub-pixel.

7. The display panel according to claim 6, wherein each of the sub-pixel cycle units comprises two red sub-pixels, and the color-resistor cycle units comprises red color resistors in a one-to-one correspondence to the red sub-pixels.

8. The display panel according to claim 7, wherein each of the color resistor cycle units further comprises a green color resistor and a blue color resist, and the green color resist is separated from the blue color resist by one of the red color resists.

9. The display panel according to claim 1, wherein each of the sub-pixel cycle units comprises six of the sub-pixels.

10. A display terminal, comprising a display panel, the display panel comprising:
    an array substrate;
    a display device layer disposed on the array substrate, comprising a plurality of sub-pixel cycle units continuously arranged, each of the sub-pixel cycle units comprising a plurality of sub-pixels of different colors and sequentially arranged; and
    a color filter layer disposed on a side of the display device layer away from the array substrate, and comprising color resistor cycle units in a one-to-one correspondence to the sub-pixel cycle units, wherein the color resistor cycle units comprise a plurality of color resistors corresponding to a portion of sub-pixels, and some of the sub-pixels in the sub-pixel cycle units are not covered by the color resistors.

11. The display terminal according to claim 10, wherein in the sub-pixel cyclic units, adjacent ones of the sub-pixels of a same color are spaced apart from each other by two adjacent sub-pixels of different colors.

12. The display terminal according to claim 11, wherein in the sub-pixel cyclic units, each of the adjacent ones of the sub-pixels of the same color constitutes a pixel unit with a sub-pixel at its one side and a sub-pixel at its another side, and adjacent ones of the pixel units share two of the sub-pixels at an overlap between the adjacent ones of the pixel units.

13. The display terminal according to claim 12, wherein in the sub-pixel cycle units, at least one of the sub-pixels of the same color has a corresponding color resistor in the color-resistor cycle units.

14. The display terminal according to claim 13, wherein in the sub-pixel cyclic units, an area of an opening of each of the sub-pixels of the same color with a corresponding color resistor is smaller than an area of an opening of each of the sub-pixels of the same color without a corresponding color resistor.

15. The display terminal according to claim 14, wherein each of the sub-pixel cycle units comprises a red sub-pixel, a green sub-pixel, and a blue sub-pixel, and the red sub-pixel is disposed between the blue sub-pixel and the green sub-pixel.

* * * * *